United States Patent
Dudding

(10) Patent No.: US 11,451,055 B2
(45) Date of Patent: Sep. 20, 2022

(54) METER APPARATUS AND METHODS USING LOAD BALANCE METRICS

(71) Applicant: Sensus Spectrum, LLC, Morrisville, NC (US)

(72) Inventor: Andrew Dudding, Cary, NC (US)

(73) Assignee: Sensus Spectrum, LLC, Morrisville, NC (US)

( * ) Notice: Subject to any disclaimer, the term of this patent is extended or adjusted under 35 U.S.C. 154(b) by 536 days.

(21) Appl. No.: 16/354,600

(22) Filed: Mar. 15, 2019

(65) Prior Publication Data
US 2020/0295565 A1   Sep. 17, 2020

(51) Int. Cl.
*H02J 3/14*   (2006.01)
*G01D 4/00*   (2006.01)
*G01R 22/10*   (2006.01)

(52) U.S. Cl.
CPC ............... *H02J 3/14* (2013.01); *G01D 4/004* (2013.01); *G01R 22/10* (2013.01); *H02J 2310/64* (2020.01)

(58) Field of Classification Search
CPC ............ H02J 3/14; G01D 4/004; G01R 22/10
See application file for complete search history.

(56) References Cited

U.S. PATENT DOCUMENTS

| | | |
|---|---|---|
| 2007/0033151 A1 | 2/2007 | Lee |
| 2010/0121586 A1 | 5/2010 | Cazorla Navarro et al. |
| 2010/0217550 A1* | 8/2010 | Crabtree ........... H02J 13/00034 702/62 |
| 2012/0078428 A1 | 3/2012 | Henderieckx |
| 2013/0204450 A1 | 8/2013 | Kagan et al. |
| 2015/0052088 A1* | 2/2015 | Arya ........................ G06N 5/04 706/12 |

OTHER PUBLICATIONS

International Search Report and Written Opinion, PCT/US2020/020923, dated Jun. 25, 2020.
Vieira; et al. *High Impedance Fault Detection and Location in Distribution Networks using Smart Meters*; IEEE; May 13, 2018; pp. 1-6.
Tangsunantham et al; *Voltage Unbalance Measurement in Three-Phase Smart Meter Applied to AMI Systems*; IEEE; May 15, 2013; pp. 1-5.

* cited by examiner

*Primary Examiner* — Bryan Bui
(74) *Attorney, Agent, or Firm* — Stanek Lemon Crouse & Meeks, P.A.

(57) ABSTRACT

An electricity meter includes a power line interface circuit configured to generate measurements of parameters for at least two electricity transmission paths. The meter also includes a balance determination circuit configured to generate at least one balance metric that indicates a balance between the electricity transmission paths from the generated measurements. The meter further includes a communications circuit configured to transmit balance information to an external recipient responsive to the at least one balance metric.

17 Claims, 5 Drawing Sheets

METER APPARATUS AND METHODS USING LOAD BALANCE METRICS

FIELD

The inventive concept relates generally to electricity meters and, more particularly, to communications capable smart meters.

BACKGROUND

Utilities are increasing using "smart" electricity meters for industrial, commercial and residential power service. Smart meters typically are capable of making basic voltage and current measurement and responsively generating measurements of power consumption and quality (e.g., kWh, kVARh) at the premises for transmission back to the utility via a communications network, thus automating the billing process. Smart meters may also have the capability to provide alerts and other status messages to support maintenance and other operations.

Smart meters may communicate using a variety of different communications Techniques, including, for example, RF, wide area network and power line carrier. For example, in the Sensus Advance Metering Infrastructure (AMI), smart meters may be included in a Sensus FlexNet® communications network in which the meters communicate with gateway nodes over licensed radio communications links, and the gateways communicate with utility or service provider hosted applications via a wide area network (WAN). Other systems may use mesh networks or other communications topologies.

Electrical service is typically provided as a 3-wire or 4-wire system. 3-wire systems typically include two phase ("live") wires (L1, L2) and a system neutral or three live wires (L1, L2, L3). 4-wire systems typically provide 3 phase wires (L1, L2, L3) and a system neutral or a wire analogous to neutral that is earthed. The neutral wire is often used to provide a current return path for load imbalances in the phase wires. Electrical load may be connected between phase and neutral or may be connected between any two phases, e.g. L1 and L2, to provide a higher supply voltage. An electric meter typically is connected between the service supply transformer and the loads to measure the energy consumed by the load.

A multitude of individual electric loads may be connected to the electrical supply wiring. These loads may not be equally distributed among the phases and may vary in the amount of power they consume over time. Therefore, there may be an imbalance among the loads on the phases.

A smart meter may be capable of measuring energy as watt hours (Wh), volt-ampere (VA) hours (Vah), and/or volt-amperes reactive (VAR) hours (VARh). These quantities may be calculated from samples of voltage and current taken by the electric smart meter. The smart meter may also be capable of accurately measuring and recording voltage, current, phase angle, and line frequency over time. Smart meters may be capable of making other measurements, such as total harmonic distortion and total demand distortion.

SUMMARY

Some embodiments of the inventive concept provide an electricity meter including a power line interface circuit configured to generate measurements of parameters for at least two electricity transmission paths. The meter also includes a balance determination circuit configured to generate at least one balance metric that indicates a balance between the electricity transmission paths from the generated measurements. The meter further includes a communications circuit configured to transmit balance information to an external recipient responsive to the at least one balance metric.

The at least one balance metric may be generated responsive to voltage and current measurements. The at least one balance metric may provide a comparison of electrical measurements, such as energy measurements, voltage measurements, current measurements, frequency measurements, phase angle measurements, harmonics measurements and/or distortion measurements.

In some embodiments, the balance information may include the at least one balance metric and/or information derived from the at least one balance metric. The information derived from the at least one balance metric may, for example, provide a comparison of at least two balance metrics. In some embodiments, the information derived from the at least one balance metric may include an alert.

Embodiments may further include associated systems and methods.

DETAILED DESCRIPTION

Figure 1:
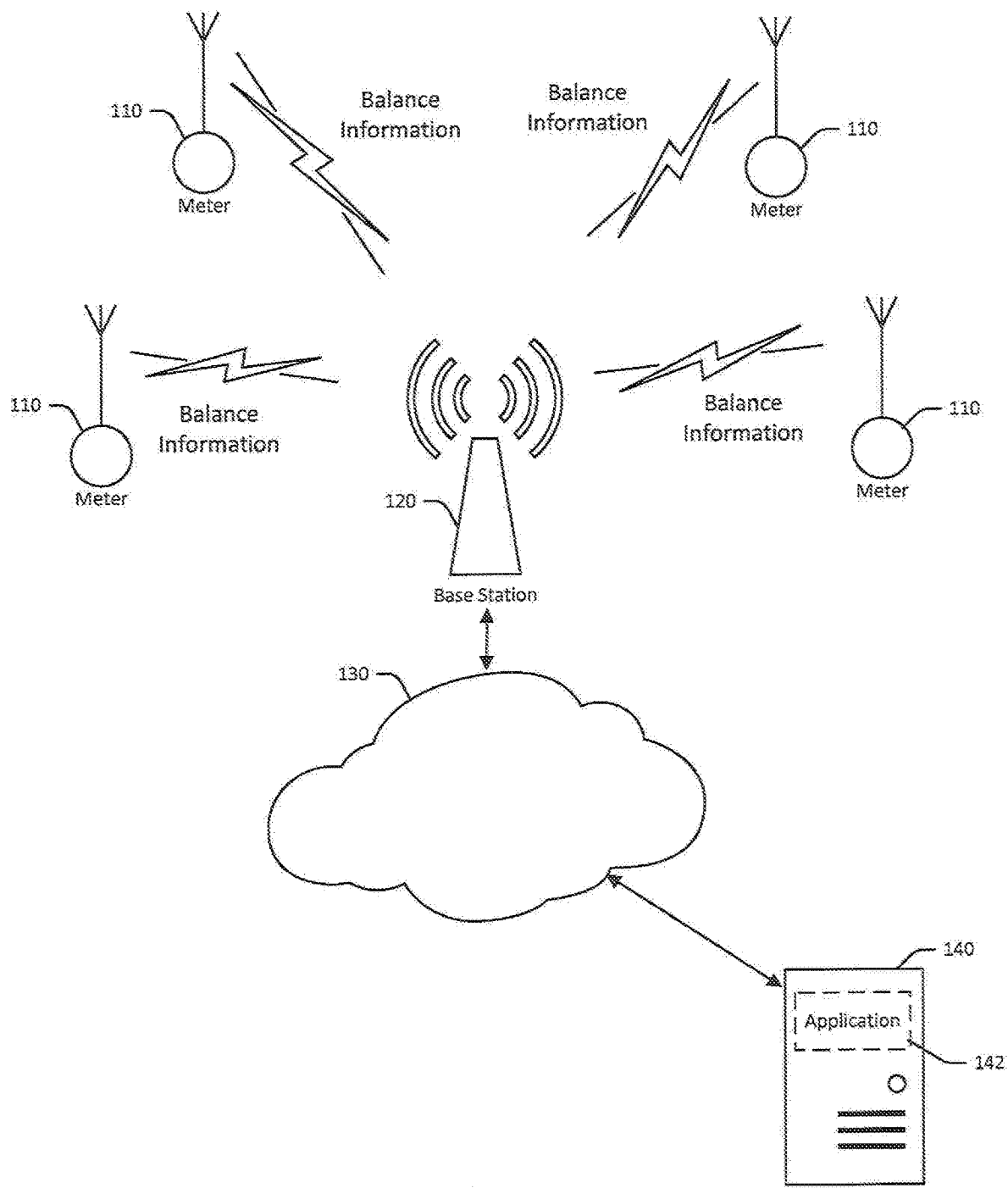
FIG. 1 illustrates a meter communication system providing load balance information according to some embodiments of the inventive concept.

The inventive concept will be described more fully hereinafter with reference to the accompanying figures, in which some embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will, be further understood that the terms "comprises", "comprising," "includes" and/or "including" when used in this specification, specify the presence of stated features, integers, steps, operations elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/".

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

Let V represent voltage measurements, I represent current measurements, $\theta$ represent phase angle measurements, F represent frequency measurements, THD represent total harmonic distortion measurements, TDD represent total demand distortion measurements. Energy $E=\Sigma(V \times I)$ i.e., the integration of the product of voltage and current over time. The values of E, V, I, $\theta$, F, THD, and TDD at a given time will differ from another instance in time. This difference is small in most cases but is capable of being measured by a smart meter.

Let Ln and Lm be a generalization of the supply paths provided by phases L1, L2 and L3, where Ln can be L1, L2 or L3 and Lm can be any other of the supply conductors. Let B represent a balance metric of any of the above measurements, for example, a scalar value represented as a percentage. Accordingly, a balance metric B may be generated that represents a measure of how the energy supplied in the Ln path differs from the Lm path. If M represents any of the measured quantities above (E, V, I, $\theta$, F, THD, or TDD) then Mn represents that value in the Ln path and Mm represents that value in the Lm path and:

$$B=((Mn-Mm)/\text{abs}(Mn)+\text{abs}(Mm)) \text{ or}$$

$$B=(Mn-Mm)/(|Mn|+|Mm|).$$

This will yield a value between −1 and 1 where 0 represents a complete balance and 1 or −1 represents a complete imbalance.

The value B can be measured at a single point in time (an instantaneous measurement) or it can be recorded over a time interval to produce data from which quantities, such as a minimum, a maximum, an average, and a standard deviation, can be derived. The time interval may be selected from any time intervals over which the meter is capable of measuring, recording, and transmitting data.

A balance metric B can serve as a measure of the quality of the load at point in the electrical distribution system at which the smart meter is located. If the balance metric B value is consistently high, then it may indicate that the load has not been wired in such a way to balance the out the loads, which can place unnecessary stress on the transformer supplying the load. Conversely, a low balance metric B indicates a well-balanced load. A balance metric B equal to zero indicates an exact balance between the Ln and Lm paths, which would be an unusual condition that is statistically unlikely to happen for any significant period of time. If it is persistent over multiple time intervals, for example, a balance metric equal to zero may indicate a potential wiring fault in the load.

The following is a non-exhaustive list of possible balance metrics:

Be, representing a balance metric derived from the energies described above;

Bw, representing a balance metric derived from wan hour values;

Bva, representing a balance metric derived from volt ampere hour values;

Bvar, representing a balance metric derived from Var hour values;

Bv, representing a balance metric derived from voltage values;

Bi, representing a balance metric derived from current values;

B$\theta$, representing a balance metric derived from the recorded phase angle values;

Bf, representing a balance metric derived from frequency values;

BTHD, representing a balance metric derived from total harmonic distortion values; and BTDD, representing a balance metric derived from total demand distortion values.

Balance metrics may be generated from comparisons of other types of electrical measurements, such as harmonics measurements.

According to further aspects of the inventive concept, these balance metrics can be compared to derive information about the quality of the load. For example, if Ben matches Bern over a time interval, but Bin and Bim do not, this indicates a mismatch with the balance of the voltages supplied to the load in the Ln and Lm paths. The extent of the mismatch in this instance can be described by the following meta-metric:

Voltage mismatch=Be/Bi.

It is possible to derive other such meta-metrics or other meta-data from, for example, comparisons of balance metrics of different types or from comparisons of balance metrics with directly measured data. A smart meter according to some embodiments of the inventive concepts may be capable of determining whether the data or derived metadata (e.g., balance metrics or comparison of balance metrics) represents an issue that would require action on the part of the meter operator. For example, if a metric exceeds a preset threshold limit, or matches a previously defined pattern, then the meter may issue alerts, e.g., warning or alarm messages, via its communication system.

A smart electricity meter may be capable of measuring and recording data over discrete time intervals. The time interval period, T, is typically operator defined but normal values for T would be 1, 2, 5, 10, 15, 30 and 60 minutes. While the smart meter already gathers directly measured quantities over these discrete time periods, in some embodiments, a smart meter may also be capable of gathering balance, metric data over the same time periods. If, for example, the minimum, maximum, average, standard deviation, or any other statistic applied over the time period for the balance metric exceeds a defined threshold or matches a defined pattern, a warning, alarm or other message may be transmitted via the meter's communications system.

FIG. 1 illustrates a metering system according to some embodiments of the inventive concept. The system includes a metering infrastructure including, an application 142 that communicates with smart electricity meters 110 via a wide area network 130 and a radio base station 120. The base station 120 communicates with the smart meters 110 via radio links, such as the licensed radio links used in, the aforementioned Sensus FlexNet® communications network. It will be appreciated that the illustrated infrastructure is provided for purposes of illustration, and some embodiments of the inventive concept may take other forms, such as cell-phone based networks and/or hardwired networks.

As further shown, the meters 110 may be configured to provide load, balance information to the application 142 via the base station 120. For example, the meters may generate one or more balance metrics or balance meta-metrics along the lines discussed above, and may communicate such metrics to the application 142. In some embodiments, the meters 110 may generate balance-related alerts and transmit them to the application 142. The application 142 may use such balance information, for example, for data analytics and/or to cause certain system operations, such as maintenance operations, to occur.

Figure 2:
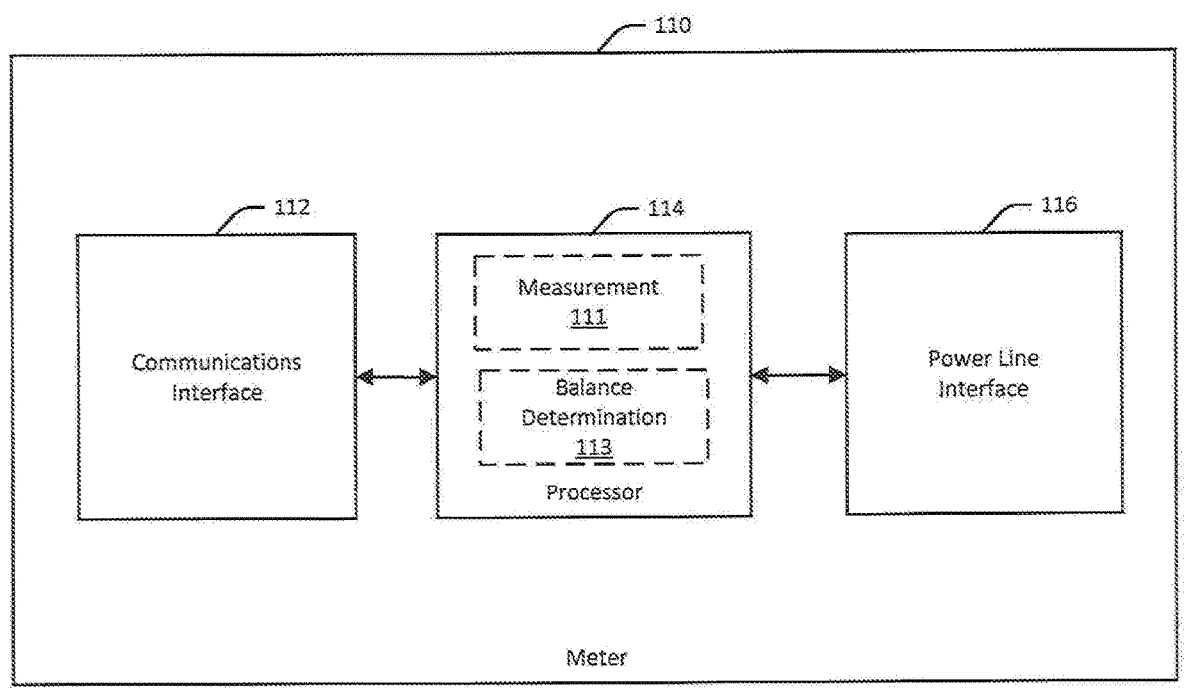
FIG. 2 illustrates a meter with a load balance information capability according to further embodiments of the inventive concept.

FIG. 2 illustrates an example configuration of such a smart electricity meter 110 according to some embodiments. The meter 110 includes a power line interface circuit 116, which may include, for example, voltage transformers, current transformers, sampling circuitry and other circuitry that interface the meter 110 to a power line for the measurement of voltage, current and other system parameters. A measurement application 111 may operate on a processor 114 and may generate power, energy, distortion and/or other values from the sampled data. The processor 114 also is programmed to provide a balance determination application 113, which may generate balance metrics along the lines discussed above. The processor 114 is coupled to a communications interface circuit 112, which supports transmission of power metrics (e.g., kWh, kVARh) along with such balance metrics and/or other information generated by the applications on the processor 114. These may be received by an external recipient through, for example, a radio communications link.

Figure 3:
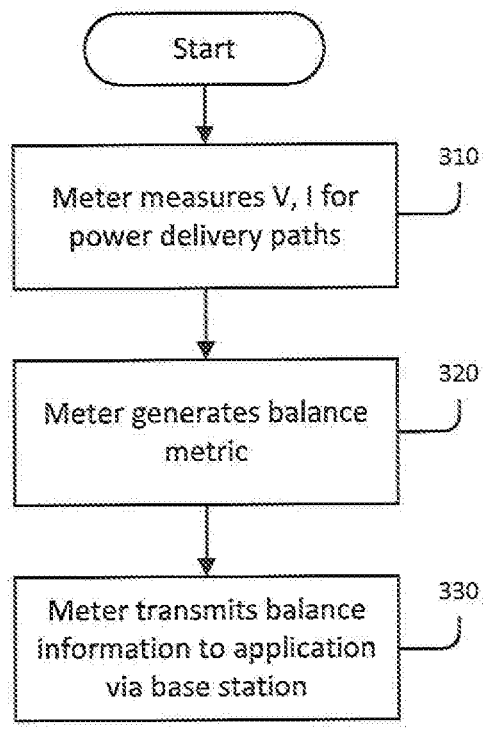
FIG. 3 is a flowchart illustrating operations for generating and communicating load balance information according some embodiments of the inventive concept.
Figure 4:
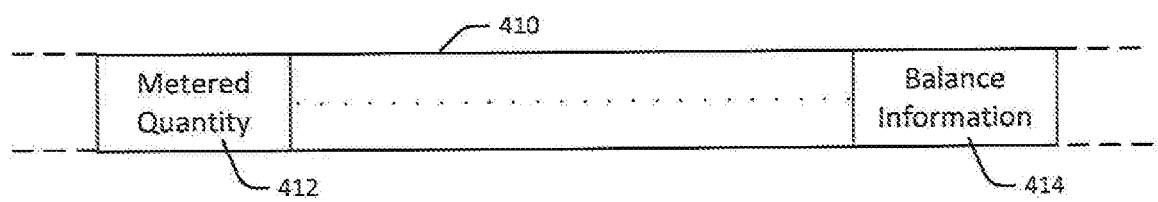
FIG. 4 is a diagram illustrating a message format for communication of load balance information according to some embodiments of the inventive concept.

FIG. 3 is a flowchart illustrating exemplary operations that may be performed by the systems and apparatus shown in FIGS. 1 and 2. An electricity meter, e.g., the meter 110 of FIG. 2, measures voltages and currents for respective power delivery paths (block 310). The meter may generate one or more balance metrics responsive to these voltage and current measurements (block 320). The meter then transmits balance information to an external application, e/g., via a radio communication with a base station, such as the base station 120 shown in FIG. 1 (block 330). The balance information may include, for example, the balance metrics themselves and/or information, such as meta-metrics or alerts, which are derived from the balance metrics. As shown in FIG. 4, such balance information 414 may be included in one or more messages 410, which may also include other meter data, such as a metered quantity (e.g., kWh, kVarh, kVAh).

Figure 5:
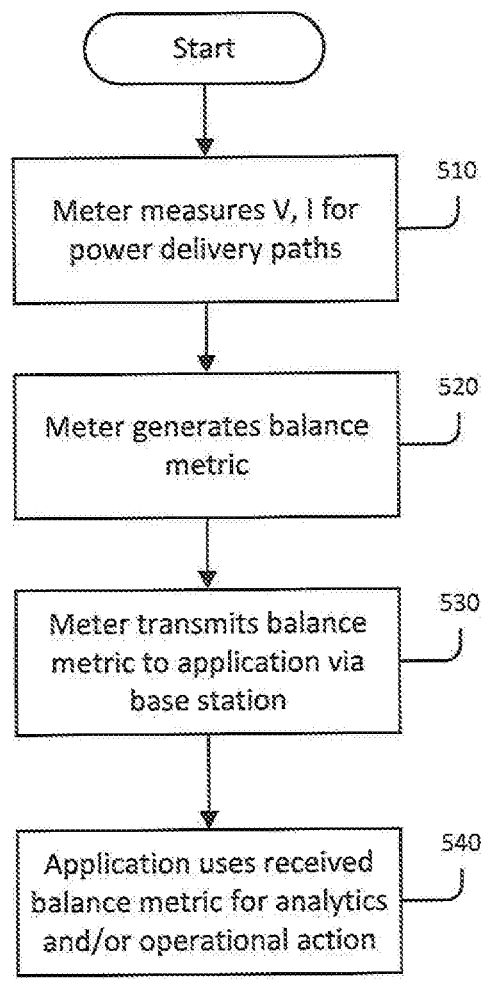
FIG. 5 is a flowchart illustrating operations for generating and transmitting a load balance index according to some embodiments of the inventive concept.

FIG. 5 is a flowchart illustrating operations according to further embodiments. A meter, such as the smart meter 110 of FIG. 2, measures voltage and current for respective power delivery paths (block 510), and generates one or more balance metrics responsive to these measurements (block 520). The meter then transmits the generated balance metrics to an application via a base station and other network infrastructure (block 530). The receiving application uses the received balance metric for purposes of system analysis and/or to trigger operational actions, such as maintenance operations.

Figure 6:
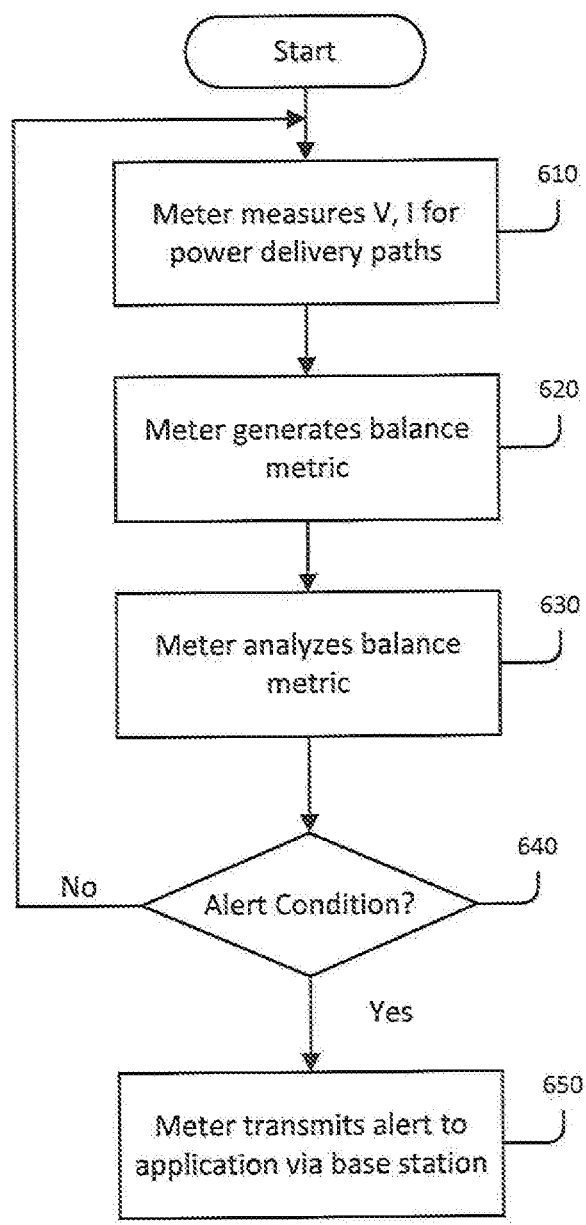
FIG. 6 is a flowchart illustrating operations for generating and transmitting a load balance alert according to some embodiments of the inventive concept.

FIG. 6 is a flowchart illustrating operations according to still further embodiments. A meter, such as the smart meter 110 of FIG. 2, measures voltage and current for respective power delivery paths (block 610), and generates one or more balance metrics responsive to these measurements (block 620). The meter analyzes the balance metric(s) to determine if an alert condition is present (blocks 630, 640). If not, the meter continues with its measurements and generation of balance metrics (blocks 610 et seq.). If the balance metric(s) indicates an alert condition, the meter generates and transmits an alert message to an external application (block 650).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An electricity meter comprising:
a power line interface circuit configured to generate measurements of parameters for at least two electricity transmission paths;
a balance determination circuit configured to generate at least one balance metric that indicates a balance between the electricity transmission paths from the generated measurements, wherein the at least one balance metric is of the form:

$$B=(Mn-Mm)/(|Mn|+|Mm|),$$

wherein Mn comprises one of an energy (E), voltage (V), current (I), phase angle (θ), frequency (F), total harmonic distortion (THD), or total demand distortion (TDD) measured for an nth path and wherein Mm comprises a corresponding one of an E, V, I, θ, F, THD, or TDD measured for an mth path; and
a communications circuit configured to transmit the at least one balance metric to an external recipient.

2. The electricity meter of claim 1, wherein the at least one balance metric is generated responsive to voltage and current measurements.

3. The electricity meter of claim 1, wherein the communications circuit is configured to transmit information derived from the at least one balance metric.

4. The electricity meter of claim 3, wherein the information derived from the at least one balance metric provides a comparison of at least two balance metrics.

5. The electricity meter of claim 3, wherein the information derived from the at least one balance metric comprises an alert.

6. The electricity meter of claim 1, wherein the communications circuit is configured to transmit the at least one balance metric in a radio signal to a base station of a wide area communications network.

7. A system comprising:
an electricity meter configured to generate measurements of parameters for at least two electricity transmission paths, to generate at least one balance metric that indicates a balance between the electricity transmission paths from the generated measurements, and to transmit the at least one balance metric over a communications medium, wherein the at least one balance metric is of the form:

$$B=(Mn-Mm)/(|Mn|+|Mm|),$$

wherein Mn comprises one of an energy (E), voltage (V), current (I), phase angle (θ), frequency (F), total harmonic distortion (THD), or total demand distortion (TDD) measured for an nth path and wherein Mm comprises a corresponding one of an E, V, I, θ, F, THD, or TDD measured for an mth path; and
an application configured to receive the transmitted at least one balance metric from the communications medium.

8. The system of claim 7, wherein the electric meter comprises:
a power line interface circuit configured to generate the measurements of the parameters for at least two electricity transmission paths;
a balance determination circuit configured to generate the at least one balance metric responsive to the generated measurements; and
a communications circuit configured to transmit the at least one balance metric to an external recipient.

9. The system of claim 7, wherein the electricity meter is configured to transmit information derived from the at least one balance metric and wherein the application is configured to receive the information derived from the at least one balance metric.

10. The system of claim 9, wherein the information derived from the at least one balance metric provides a comparison of at least two balance metrics.

11. The system of claim 9, wherein the information derived from the at least one balance metric comprises an alert.

12. The system of claim 7, wherein the communications medium comprises a radio communications medium.

13. A method comprising:
at an electricity meter, generating measurements of parameters for at least two electricity transmission paths, generating at least one balance metric that indicates a balance between the electricity transmission paths from the generated measurements, and transmitting balance information responsive to the at least one balance metric over a communications medium, wherein the at least one balance metric is of the form:

$$B=(Mn-Mm)/(|Mn|+|Mm|),$$

wherein Mn comprises one of an energy (E), voltage (V), current (I), phase angle (θ), frequency (F), total harmonic distortion (THD), or total demand distortion (TDD) measured for an nth path and wherein Mm comprises a corresponding one of an E, V, I, θ, F, THD, or TDD measured for an mth path.

14. The method of claim 13, further comprising transmitting information derived from the at least one balance metric over the communications medium.

15. The method of claim 14, wherein the information derived from the at least one balance metric provides a comparison of at least two balance metrics.

16. The method of claim 14, wherein the information derived from the at least one balance metric comprises an alert.

17. The method of claim 13, further comprising receiving the transmitted at least one balance metric at an application external to the electricity meter via a radio base station of a wide area network.

* * * * *

UNITED STATES PATENT AND TRADEMARK OFFICE
CERTIFICATE OF CORRECTION

| | | |
|---|---|---|
| PATENT NO. | : 11,451,055 B2 | |
| APPLICATION NO. | : 16/354600 | |
| DATED | : September 20, 2022 | |
| INVENTOR(S) | : Andrew Dudding | |

It is certified that error appears in the above-identified patent and that said Letters Patent is hereby corrected as shown below:

On the Title Page

(56) References: Please correct "2007/003151 2/2007 Lee" to read -- 2007/003151 2/2007 Lee, Jr. --

In the Specification

Column 4, Line 48: Please correct "Bern over" to read -- Bem over --

Signed and Sealed this
Twentieth Day of December, 2022

Katherine Kelly Vidal
*Director of the United States Patent and Trademark Office*